US009324479B2

(12) United States Patent
Sugiyama

(10) Patent No.: US 9,324,479 B2
(45) Date of Patent: Apr. 26, 2016

(54) DIFFERENTIAL TRANSMISSION CABLE AND MULTIPAIR DIFFERENTIAL TRANSMISSION CABLE

(71) Applicant: Hitachi Metals, Ltd., Tokyo (JP)

(72) Inventor: Takahiro Sugiyama, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/327,481

(22) Filed: Jul. 9, 2014

(65) Prior Publication Data

US 2015/0021063 A1 Jan. 22, 2015

(30) Foreign Application Priority Data

Jul. 16, 2013 (JP) ................................ 2013-147619

(51) Int. Cl.

*H05K 9/00* (2006.01)
*H01B 11/00* (2006.01)
*H01R 9/03* (2006.01)
*H01R 24/56* (2011.01)
*H01B 11/20* (2006.01)

(52) U.S. Cl.

CPC .............. *H01B 11/002* (2013.01); *H01R 9/034* (2013.01); *H01R 24/562* (2013.01); *H01B 11/20* (2013.01)

(58) Field of Classification Search

CPC ................................. H01R 9/05; H01R 9/034
USPC ................................................ 174/75 C, 78
See application file for complete search history.

(56) References Cited

U.S. PATENT DOCUMENTS

| | | | | |
|---|---|---|---|---|
| 4,096,346 | A * | 6/1978 | Stine et al. | 174/36 |
| 5,347,090 | A * | 9/1994 | Cerda | 174/84 R |
| 5,956,445 | A * | 9/1999 | Deitz et al. | 385/100 |
| 6,403,887 | B1 * | 6/2002 | Kebabjian et al. | 174/110 R |
| 6,485,335 | B1 * | 11/2002 | Dewdney | 439/607.5 |
| 6,528,731 | B2 * | 3/2003 | Murakami et al. | 174/117 F |
| 2006/0054334 | A1 * | 3/2006 | Vaupotic et al. | 174/36 |
| 2013/0072041 | A1 * | 3/2013 | Nonen | H01R 9/035 439/98 |

FOREIGN PATENT DOCUMENTS

| | | |
|---|---|---|
| JP | 2001-093357 A | 4/2001 |
| JP | 2011-086458 A | 4/2011 |

* cited by examiner

*Primary Examiner* — Chau N Nguyen
(74) *Attorney, Agent, or Firm* — McGinn IP Law Group PLLC

(57) ABSTRACT

A differential transmission cable includes a pair of inner conductors; an insulator that separately or integrally covers the pair of inner conductors; an outer conductor disposed around the insulator; a wrapping tape wound around the outer conductor; and a drain wire disposed outside of the wrapping tape, the drain wire being electrically connected to the outer conductor for grounding the outer conductor.

16 Claims, 1 Drawing Sheet

DIFFERENTIAL TRANSMISSION CABLE AND MULTIPAIR DIFFERENTIAL TRANSMISSION CABLE

The present application is based on Japanese patent application No. 2013-147619 filed on Jul. 16, 2013, the entire contents of which are incorporated herein by reference.

BACKGROUND OF THE INVENTION

1. Field of the Invention

The present invention relates to a differential transmission cable and a multipair differential transmission cable.

2. Description of the Related Art

There is a known a differential transmission cable having the following structure: a pair of insulated wires, each including an inner conductor and an insulator covering the inner conductor, are arranged parallel to each other; an outer conductor (shield) is formed by winding a metal tape around the pair of insulated wires; and a wrapping tape is wound around the outer conductor so that the metal tape may not become loose.

Such a differential transmission cable has a problem in that, when the outer conductor is directly soldered to a ground pattern of a printed circuit board or the like, the insulator may become damaged (deformed) due to heat during soldering and therefore the connection yield is decreased.

To address the problem, a differential transmission cable including a drain wire for grounding the outer conductor is used. The drain wire is electrically connected the outer conductor, and the outer conductor can be grounded through the drain wire by electrically connecting the drain wire to a ground pattern of a printed circuit board or the like.

Typically, a drain wire is disposed inside of the outer conductor. However, the drain wire may be disposed outside of the outer conductor, that is, between the outer conductor and the wrapping tape.

Japanese Unexamined Patent Application Publication Nos. 2001-93357 and 2011-86458 describe technologies related to the present application.

However, when the drain wire is disposed inside of the outer conductor, a problem arises in that properties of the cable, such as intra-pair skew and Scd21, may become degraded if the position of the drain wire is displaced only slightly.

When the drain wire is disposed between the outer conductor and the wrapping tape, a problem arises in that the metal tape is not sufficiently pressed by the wrapping tape and therefore properties of the cable, such as intra-pair skew and Scd21, may become degraded.

SUMMARY OF THE INVENTION

An object of the present invention to solve the aforementioned problems and provide a differential transmission cable and a multipair differential transmission cable that can suppress degradation of properties thereof due to displacement of a drain wire.

According to an aspect of the present invention, there is provided differential transmission cable including a pair of inner conductors; an insulator that separately or integrally covers the pair of inner conductors; an outer conductor disposed around the insulator; a wrapping tape wound around the outer conductor; and a drain wire disposed outside of the wrapping tape, the drain wire being electrically connected to the outer conductor for grounding the outer conductor.

The drain wire may be electrically connected to an exposed portion of the outer conductor at an end of the cable, and the drain wire may be electrically connected to the outer conductor only at the end of the cable.

The differential transmission wire may further include a drain fixing member for fixing the drain wire to the exposed portion of the outer conductor at the end of the cable, and the drain wire may be electrically connected to the outer conductor by soldering the drain fixing member to the drain wire and the outer conductor.

The differential transmission cable may further include a tying member for tying the drain wire to an outer periphery of the wrapping tape, and a part of the drain wire in a longitudinal direction may be tied to the outer periphery of the wrapping tape using the tying member.

The insulator may integrally cover the pair of inner conductors.

The outer conductor may include a metal tape including a resin layer and a metal layer formed on one side of the resin layer, and the outer conductor may be wound around the insulator in such a way that the metal layer faces outward.

A pair of the drain wires may be disposed on both sides of the wrapping tape in such a way that the wrapping tape is disposed between the pair of drain wires in a direction in which the pair of inner conductors are arranged.

According to another aspect of the present invention, there is provided a multipair differential transmission cable including a plurality of the differential transmission cables each according to Claim 1 and a jacket that integrally covers an outer periphery of the plurality of differential transmission cables.

The present invention can provide a differential transmission cable and a multipair differential transmission cable that can suppress degradation of properties thereof due to displacement of a drain wire.

DESCRIPTION OF THE PREFERRED EMBODIMENTS

Hereinafter, embodiments of the present invention will be described with reference to the drawings.

Figure 1:
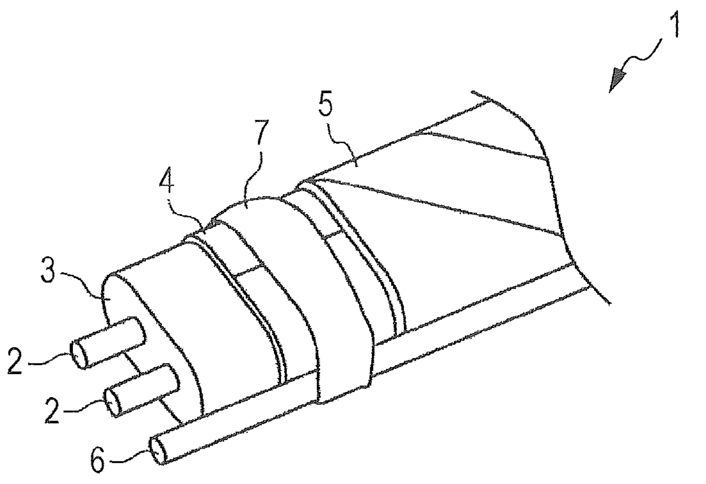
FIG. 1 is a perspective view of a differential transmission cable according to an embodiment of the present invention.

FIG. 1 is a perspective view of a differential transmission cable according to an embodiment of the present invention.

As illustrated in FIG. 1, a differential transmission cable 1 includes a pair of inner conductors 2 that are parallelly arranged, an insulator 3 that integrally covers the pair of inner conductors 2, an outer conductor 4 disposed around the insulator 3, a wrapping tape 5 wound around the outer conductor 4, and a drain wire 6 for grounding the outer conductor 4. The drain wire 6 is electrically connected to the outer conductor 4.

The outer conductor 4 is a metal tape including a resin layer and a metal layer formed on one side of the resin layer. In the present embodiment, the outer conductor 4 is a copper tape including a resin layer made of PET (polyethylene terephthalate) and a metal layer made of copper and formed on the resin layer.

The outer conductor 4 is wound around the insulator 3 in such a way that the metal layer thereof faces outward. In the present embodiment, the outer conductor 4 is formed by winding a metal tape around the insulator 3. However, this is not a limitation, and the outer conductor 4 may be formed by helically winding (wrapping) a metal tape around the insulator 3.

A resin tape, such as a PET tape, may be used as the wrapping tape 5. The wrapping tape 5, which serves to suppress loosening of the outer conductor 4, is helically wound around the outer conductor 4.

In the present embodiment, the wrapping tape 5 is wound in a single layer. However, the wrapping tape 5 may be wound in two layers. In the case where the wrapping tape 5 is wound in two layers, it is preferable that the two layers be wound in the same direction (same-direction winding) so that the two layers can be wound smoothly in a manufacturing process.

The drain wire 6 may be a single-strand wire or a stranded wire including a plurality of (for example, seven) strands. The drain wire 6 may be a rectangular drain wire having a rectangular shape in cross-sectional view.

In the differential transmission cable 1 according to the present embodiment, the drain wire 6 is disposed outside of the wrapping tape 5. The drain wire 6 is disposed so as to extend along the outer periphery of the wrapping tape 5.

The drain wire 6 is electrically connected an exposed portion of the outer conductor 4 at an end of the cable, which is formed by stripping the cable in a stepwise manner. The drain wire 6 is electrically connected to the outer conductor 4 only at the end of the cable. If it is not necessary to ground the outer conductor 4 through the drain wire 6 at one end of the cable, which is the case when, for example, a connector or the like is attached to the end of the cable, the drain wire 6 may be electrically connected to the outer conductor 4 only at the other end of the cable.

In the present embodiment, the differential transmission cable 1 further includes a drain fixing member 7 for fixing the drain wire 6 to an exposed portion of the outer conductor 4 at the end of the cable. The drain wire 6 is electrically connected to the outer conductor 4 by winding the drain fixing member 7 around the outer conductor 4 and by soldering the drain fixing member 7 to both of the outer conductor 4 and the drain wire 6.

As the drain fixing member 7, a material having a low thermal capacity and a good solderability may be used. Examples of such a material include a metal foil, such as a copper foil; and a bundle (stranded wire) of a plurality of thin metal wires, such as copper wires. By using such a material, the soldering time can be reduced, damage to the insulator 3 due to heat can be suppressed, and the connection yield can be improved.

Without using the drain fixing member 7, the drain wire 6 can be directly soldered to the outer conductor 4, for example, as follows: first, a part the drain wire 6 is wound around the exposed portion of the outer conductor 4 at the end of the cable; then, an end portion of the drain wire 6 is arranged so as to extend parallel to the inner conductor 2; and finally, the part of the drain wire 6 wound around the outer conductor 4 is soldered to the outer conductor 4. In other words, instead of using the drain fixing member 7, a part of the drain wire 6 may be temporarily wound around the outer conductor 4 and then fixed to the outer conductor 4. In this case, in order to reduce the soldering time, it is preferable that a stranded wire be used as the drain wire 6.

In parts of the differential transmission cable 1 other than the end of the cable 1, the drain wire 6 may be fixed or may not be fixed to the outer periphery of the wrapping tape 5.

In the case where the drain wire 6 is to be fixed to the outer periphery of the wrapping tape 5, the differential transmission cable 1 may further include tying members for typing the drain wire 6 to the outer periphery of the wrapping tape 5, the tying members may be disposed along the cable at a predetermined pitch in the longitudinal direction, and parts of the drain wire 6 in the longitudinal direction may be fixed to the outer periphery of the wrapping tape 5.

Figure 2:
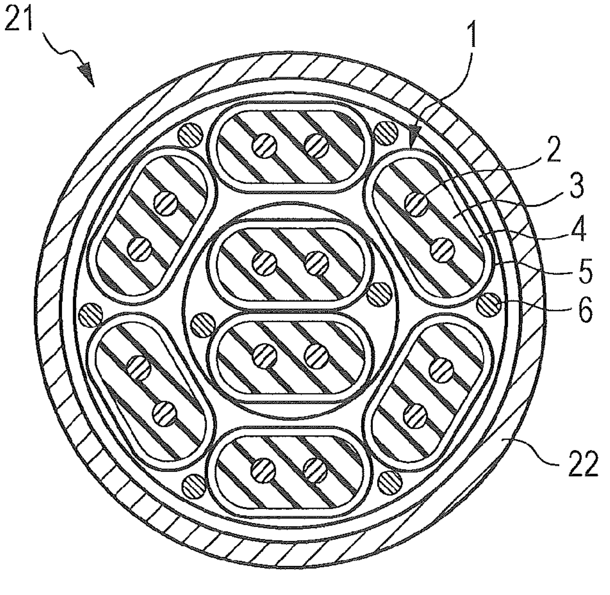
FIG. 2 is a cross-sectional view of a multipair differential transmission cable including a plurality of the differential transmission cables shown in FIG. 1.

FIG. 2 illustrates a multipair differential transmission cable 21 including a plurality of differential transmission cables 1 shown in FIG. 1 and a jacket 22 that integrally covers the outer periphery of the plurality of differential transmission cables 1.

It is preferable that the number of the differential transmission cables 1 be two or eight so that the multipair differential transmission cable 21 can have a substantially circular cross-sectional shape. FIG. 2 shows a case where eight differential transmission cables 1 are used.

The multipair differential transmission cable 21 is formed by stranding (cabling) the differential transmission cables 1 in a state in which the drain wires 6 extend along the outer peripheries of the wrapping tapes 5. Because each of the drain wires 6 is housed in a space between the wrapping tapes 5 of adjacent differential transmission cables 1, the outside diameter of the cable is scarcely increased despite the presence of the drain wires 6. Therefore, decrease in the flexibility of the cable due to an increase in the outside diameter of the cable can be suppressed.

As heretofore described, in the differential transmission cable 1 according to the present embodiment, the drain wire 6 is disposed outside of the wrapping tape 5.

By disposing the drain wire 6 outside of the wrapping tape 5, even if the position of the drain wire 6 becomes displaced, properties such as intra-pair skew and Scd21 are not affected. In other words, the differential transmission cable 1 according to the present embodiment can suppress degradation of properties thereof due to displacement of the drain wire 6.

The present invention is not limited to the embodiment described above and can be modified in various ways within the spirit and scope of the present invention.

Figure 3:
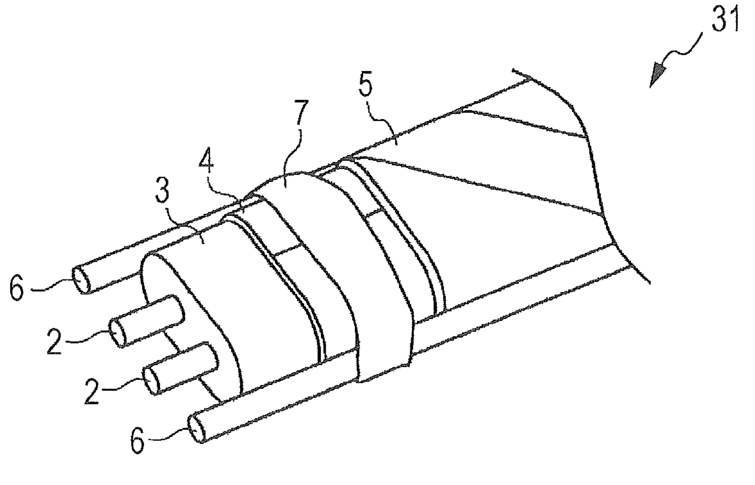
FIG. 3 is a perspective view of a differential transmission cable according to a modified embodiment of the present invention.

For example, in the embodiment described above, a single drain wire 6 is used. However, this is not a limitation, and a plurality of drain wires 6 may be used. In a case where a pair of drain wires 6 are used, as in a differential transmission cable 31 shown in FIG. 3, it is preferable that the pair of drain wires 6 be disposed on both sides of the wrapping tape 5 in such a way that the wrapping tape 5 is disposed between the pair of drain wires 6 in a direction in which the pair of inner conductors 2 are arranged. Thus, the drain wires 6, which have a ground potential, can be disposed on both sides of the inner conductor 2, which serve as signal lines. Accordingly, degradation of properties at portions at which the cable is connected to a printed circuit board or the like can be suppressed. Moreover, ends of conductors (the inner conductor 2 and the drain wire 6) to be connected to a printed circuit board or the like are arranged along a line, and therefore an operation of connecting the conductors to the printed circuit board or the like can be facilitated.

In the embodiment described above, the insulator 3 integrally covers the pair of inner conductors 2. However, the present invention can be also applied to a case where the insulator 3 independently covers the pair of inner conductors 2.

What is claimed is:

1. A differential transmission cable comprising:

a pair of inner conductors;

an insulator that separately or integrally covers the pair of inner conductors;

an outer conductor disposed around the insulator;

a wrapping tape wound around the outer conductor; and a drain wire disposed outside of the wrapping tape, the drain wire being electrically connected to the outer conductor for grounding the outer conductor, wherein the drain wire is electrically connected to an exposed portion of the outer conductor at an end of the cable, and the drain wire is electrically connected to the outer conductor only at the end of the cable, wherein the insulator integrally covers the pair of inner conductors, and wherein the outer conductor includes a metal tape including a resin layer and a metal layer formed on one side of the resin layer, and the outer conductor is wound around the insulator in such a way that the metal layer faces outward, the differential transmission cable further comprising:

a tying member for tying the drain wire to an outer periphery of the wrapping tape, wherein a part of the drain wire in a longitudinal direction is tied to the outer periphery of the wrapping tape using the tying member.

2. The differential transmission cable according to claim 1, further comprising:

a drain fixing member for fixing the drain wire to the exposed portion of the outer conductor at the end of the cable, wherein the drain wire is electrically connected to the outer conductor by soldering the drain fixing member to the drain wire and the outer conductor.

3. The differential transmission cable according to claim 1, wherein a pair of the drain wires are disposed on both sides of the wrapping tape in such a way that the wrapping tape is disposed between the pair of drain wires in a direction in which the pair of inner conductors are arranged.

4. A multipair differential transmission cable comprising:

a plurality of the differential transmission cables each according to claim 1; and a jacket that integrally covers an outer periphery of the plurality of differential transmission cables.

5. The differential transmission cable according to claim 1, further comprising a drain fixing member for fixing the drain wire to the differential transmission cable, wherein the drain fixing member is disposed in a region of the outer conductor exposed from the wrapping tape.

6. The differential transmission cable according to claim 1, wherein the drain wire directly contacts an outside face of the metal layer of the metal tape.

7. The differential transmission cable according to claim 1, wherein the outer conductor is in constant contact with the insulator.

8. The differential transmission cable according to claim 1, wherein the resin layer of the metal tape of the outer conductor is not separated from the insulator.

9. The differential transmission cable according to claim 1, wherein an outer surface of the insulator and an inner surface of the outer conductor are equally distant from the pair of inner conductors.

10. The differential transmission cable according to claim 1, wherein an outer circumference of the insulator and an inner circumference of the outer conductor are equal.

11. The differential transmission cable according to claim 1, wherein the resin layer contacts the insulator.

12. The differential transmission cable according to claim 1, wherein the insulator, the resin layer, and the metal layer are sequentially disposed such that there is no separation therebetween.

13. The differential transmission cable according to claim 1, wherein the pair of inner conductors are arranged in parallel.

14. The differential transmission cable according to claim 1, wherein the resin layer comprises polyethylene terephthalate (PET) and the metal layer comprises copper.

15. A differential transmission cable comprising:

a pair of inner conductors;

an insulator that separately or integrally covers the pair of inner conductors;

an outer conductor disposed around the insulator;

a wrapping tape wound around the outer conductor; and a drain wire disposed outside of the wrapping tape, the drain wire being electrically connected to the outer conductor for grounding the outer conductor, wherein the drain wire is electrically connected to an exposed portion of the outer conductor at an end of the cable, and the drain wire is electrically connected to the outer conductor only at the end of the cable, wherein the insulator integrally covers the pair of inner conductors, and wherein the outer conductor includes a metal tape including a resin layer and a metal layer formed on one side of the resin layer, and the outer conductor is wound around the insulator in such a way that the metal layer faces outward, and wherein the drain wire contacts the wrapping tape and the outer conductor.

16. A differential transmission cable comprising:

a pair of inner conductors;

an insulator that separately or integrally covers the pair of inner conductors;

an outer conductor disposed around the insulator;

a wrapping tape wound around the outer conductor; and a drain wire disposed outside of the wrapping tape, the drain wire being electrically connected to the outer conductor for grounding the outer conductor, wherein the drain wire is electrically connected to an exposed portion of the outer conductor at an end of the cable, and the drain wire is electrically connected to the outer conductor only at the end of the cable, wherein the insulator integrally covers the pair of inner conductors, and wherein the outer conductor includes a metal tape including a resin layer and a metal layer formed on one side of the resin layer, and the outer conductor is wound around the insulator in such a way that the metal layer faces outward, the differential transmission cable further comprising:

a drain fixing member for fixing the drain wire to the exposed portion of the outer conductor at the end of the cable;

a tying member for tying the drain wire to an outer periphery of the wrapping tape, wherein a part of the drain wire in a longitudinal direction is tied to the outer periphery of the wrapping tape using the tying member, and wherein the drain wire is electrically connected to the outer conductor by soldering the drain fixing member to the drain wire and the outer conductor.

* * * * *